(12) United States Patent
D'Evelyn et al.

(10) Patent No.: US 8,435,347 B2
(45) Date of Patent: May 7, 2013

(54) HIGH PRESSURE APPARATUS WITH STACKABLE RINGS

(75) Inventors: Mark P. D'Evelyn, Goleta, CA (US); Joseph A. Kapp, Albany, NY (US); John C. Lawrenson, Albany, NY (US)

(73) Assignees: Soraa, Inc., Fremont, CA (US); Elmhurst Research, Inc., Albany, NY (US)

( * ) Notice: Subject to any disclaimer, the term of this patent is extended or adjusted under 35 U.S.C. 154(b) by 285 days.

(21) Appl. No.: 12/891,668

(22) Filed: Sep. 27, 2010

(65) Prior Publication Data

US 2012/0137966 A1    Jun. 7, 2012

Related U.S. Application Data

(60) Provisional application No. 61/246,650, filed on Sep. 29, 2009.

(51) Int. Cl.
*B01J 3/04* (2006.01)

(52) U.S. Cl.
USPC ............. 117/224; 117/68; 117/69; 117/71; 117/200; 117/206

(58) Field of Classification Search ............. 117/68–69, 117/71, 200, 206, 224, 952
See application file for complete search history.

(56) References Cited

U.S. PATENT DOCUMENTS

| | | | |
|---|---|---|---|
| 3,245,760 A | 4/1966 | Sawyer | |
| 3,303,053 A | 2/1967 | Strong et al. | |
| 3,335,084 A | 8/1967 | Hall | |
| 4,030,966 A | 6/1977 | Hornig et al. | |
| 4,430,051 A | 2/1984 | Von Platen | |
| 5,868,837 A | 2/1999 | DiSalvo et al. | |
| 6,090,202 A | 7/2000 | Klipov | |
| 6,129,900 A | 10/2000 | Satoh et al. | |
| 6,152,977 A | 11/2000 | D'Evelyn | |
| 6,350,191 B1 | 2/2002 | D'Evelyn et al. | |

(Continued)

FOREIGN PATENT DOCUMENTS

| | | |
|---|---|---|
| JP | 2005-289797 A2 | 10/2005 |
| JP | 2007-039321 A | 2/2007 |

(Continued)

OTHER PUBLICATIONS

Lide, et al. publication entitled "Thermal conductivity of ceramics and other insulating materials," CRC Handbook of Chemistry and Physics, 91st Edition, pp. 12-203 and 12-204 (2010-2011).*

(Continued)

*Primary Examiner* — Michael Kornakov
*Assistant Examiner* — Kenneth A Bratland, Jr.
(74) *Attorney, Agent, or Firm* — Kilpatrick Townsend & Stockton LLP

(57) ABSTRACT

A high pressure apparatus and related methods for processing supercritical fluids is described. The apparatus includes a capsule, a heater, at least one ceramic ring with one or more scribe marks and/or cracks present. The apparatus optionally has a metal sleeve containing each ceramic ring. The apparatus also has a high-strength enclosure, end flanges with associated insulation, and a power control system. The apparatus is capable of accessing pressures and temperatures of 0.2-2 GPa and 400-1200° C., respectively.

24 Claims, 3 Drawing Sheets

U.S. PATENT DOCUMENTS

| | | | |
|---|---|---|---|
| 6,372,002 B1 | 4/2002 | D'Evelyn et al. | |
| 6,398,867 B1 | 6/2002 | D'Evelyn et al. | |
| 6,406,776 B1 | 6/2002 | D'Evelyn | |
| 6,455,877 B1 | 9/2002 | Ogawa et al. | |
| 6,475,254 B1 | 11/2002 | Saak et al. | |
| 6,533,874 B1 | 3/2003 | Vaudo et al. | |
| 6,541,115 B2 | 4/2003 | Pender et al. | |
| 6,596,040 B2 | 7/2003 | Saak et al. | |
| 6,596,079 B1 | 7/2003 | Vaudo et al. | |
| 6,639,925 B2 | 10/2003 | Niwa et al. | |
| 6,656,615 B2 | 12/2003 | Dwilinski et al. | |
| 6,764,297 B2 | 7/2004 | Godwin et al. | |
| 6,765,240 B2 | 7/2004 | Tischler et al. | |
| 6,784,463 B2 | 8/2004 | Camras et al. | |
| 6,787,814 B2 | 9/2004 | Udagawa | |
| 6,806,508 B2 | 10/2004 | D'Evelyn et al. | |
| 6,858,882 B2 | 2/2005 | Tsuda et al. | |
| 6,861,130 B2 | 3/2005 | D'Evelyn et al. | |
| 6,936,488 B2 | 8/2005 | D'Evelyn et al. | |
| 6,955,719 B2 | 10/2005 | Dmitriev et al. | |
| 7,001,577 B2 | 2/2006 | Zimmerman et al. | |
| 7,009,199 B2 | 3/2006 | Hall et al. | |
| 7,009,215 B2 | 3/2006 | D'Evelyn et al. | |
| 7,012,279 B2 | 3/2006 | Wierer Jr. et al. | |
| 7,026,755 B2 | 4/2006 | Setlur et al. | |
| 7,033,858 B2 | 4/2006 | Chai et al. | |
| 7,053,413 B2 | 5/2006 | D'Evelyn et al. | |
| 7,063,741 B2 | 6/2006 | D'Evelyn et al. | |
| 7,067,407 B2 | 6/2006 | Kostamo et al. | |
| 7,078,731 B2 | 7/2006 | D'Evelyn et al. | |
| 7,098,487 B2 | 8/2006 | D'Evelyn et al. | |
| 7,101,433 B2 | 9/2006 | D'Evelyn et al. | |
| 7,102,158 B2 | 9/2006 | Tysoe et al. | |
| 7,105,865 B2 | 9/2006 | Nakahata et al. | |
| 7,112,829 B2 | 9/2006 | Picard et al. | |
| 7,119,372 B2 | 10/2006 | Stokes et al. | |
| 7,122,827 B2 | 10/2006 | Alizadeh et al. | |
| 7,125,453 B2 | 10/2006 | D'Evelyn et al. | |
| 7,160,388 B2 | 1/2007 | Dwilinski et al. | |
| 7,160,531 B1 | 1/2007 | Jacques et al. | |
| 7,175,704 B2 | 2/2007 | D'Evelyn et al. | |
| 7,198,671 B2 | 4/2007 | Ueda | |
| 7,208,393 B2 | 4/2007 | Haskell et al. | |
| 7,220,658 B2 | 5/2007 | Haskell et al. | |
| 7,252,712 B2 | 8/2007 | Dwilinski et al. | |
| 7,285,801 B2 | 10/2007 | Eliashevich et al. | |
| 7,291,544 B2 | 11/2007 | D'Evelyn et al. | |
| 7,316,746 B2 | 1/2008 | D'Evelyn et al. | |
| 7,329,371 B2 | 2/2008 | Setlur et al. | |
| 7,335,262 B2 | 2/2008 | Dwilinski et al. | |
| 7,338,828 B2 | 3/2008 | Imer et al. | |
| 7,358,542 B2 | 4/2008 | Radkov et al. | |
| 7,364,619 B2 | 4/2008 | Dwilinski et al. | |
| 7,368,015 B2 | 5/2008 | D'Evelyn et al. | |
| 7,381,391 B2 | 6/2008 | Spencer et al. | |
| 7,420,261 B2 | 9/2008 | Dwilinski et al. | |
| 7,572,425 B2 | 8/2009 | McNulty et al. | |
| 7,625,446 B2 | 12/2009 | D'Evelyn et al. | |
| 7,642,122 B2 | 1/2010 | Tysoe et al. | |
| 7,704,324 B2 | 4/2010 | D'Evelyn et al. | |
| 7,705,276 B2 | 4/2010 | Giddings et al. | |
| 7,759,710 B1 | 7/2010 | Chiu et al. | |
| 7,871,839 B2 | 1/2011 | Lee et al. | |
| 7,976,630 B2 | 7/2011 | Poblenz et al. | |
| 8,021,481 B2 | 9/2011 | D'Evelyn | |
| 8,048,225 B2 | 11/2011 | Poblenz et al. | |
| 8,097,081 B2 * | 1/2012 | D'Evelyn | 117/68 |
| 8,148,801 B2 | 4/2012 | D'Evelyn | |
| 8,188,504 B2 | 5/2012 | Lee | |
| 8,198,643 B2 | 6/2012 | Lee et al. | |
| 8,207,548 B2 | 6/2012 | Nagai | |
| 8,284,810 B1 | 10/2012 | Sharma et al. | |
| 8,299,473 B1 | 10/2012 | D'Evelyn et al. | |
| 8,303,710 B2 | 11/2012 | D'Evelyn | |
| 8,306,081 B1 | 11/2012 | Schmidt et al. | |
| 8,323,405 B2 | 12/2012 | D'Evelyn | |
| 8,329,511 B2 | 12/2012 | D'Evelyn | |
| 2001/0009134 A1 | 7/2001 | Kim et al. | |
| 2001/0011935 A1 | 8/2001 | Lee et al. | |
| 2001/0048114 A1 | 12/2001 | Morita et al. | |
| 2002/0070416 A1 | 6/2002 | Morse et al. | |
| 2002/0105986 A1 | 8/2002 | Yamasaki | |
| 2002/0182768 A1 | 12/2002 | Morse et al. | |
| 2002/0189532 A1 | 12/2002 | Motoki et al. | |
| 2003/0027014 A1 | 2/2003 | Johnson et al. | |
| 2003/0140845 A1 * | 7/2003 | D'Evelyn et al. | 117/8 |
| 2003/0145784 A1 | 8/2003 | Thompson et al. | |
| 2003/0164507 A1 | 9/2003 | Edmond et al. | |
| 2003/0183155 A1 | 10/2003 | D'Evelyn et al. | |
| 2003/0209191 A1 | 11/2003 | Purdy | |
| 2003/0232512 A1 | 12/2003 | Dickinson et al. | |
| 2004/0000266 A1 | 1/2004 | D'Evelyn et al. | |
| 2004/0023427 A1 | 2/2004 | Chua et al. | |
| 2004/0104391 A1 | 6/2004 | Maeda et al. | |
| 2004/0124435 A1 | 7/2004 | D'Evelyn et al. | |
| 2004/0161222 A1 | 8/2004 | Niida et al. | |
| 2004/0222357 A1 | 11/2004 | King et al. | |
| 2005/0087753 A1 | 4/2005 | D'Evelyn et al. | |
| 2005/0098095 A1 | 5/2005 | D'Evelyn et al. | |
| 2005/0109240 A1 | 5/2005 | Maeta et al. | |
| 2005/0121679 A1 | 6/2005 | Nagahama et al. | |
| 2005/0128469 A1 | 6/2005 | Hall et al. | |
| 2005/0152820 A1 * | 7/2005 | D'Evelyn et al. | 422/245.1 |
| 2005/0167680 A1 | 8/2005 | Shei et al. | |
| 2005/0191773 A1 | 9/2005 | Suzuki et al. | |
| 2005/0205215 A1 | 9/2005 | Giddings et al. | |
| 2005/0263791 A1 | 12/2005 | Yanagihara et al. | |
| 2006/0030738 A1 | 2/2006 | Vanmaele et al. | |
| 2006/0032428 A1 | 2/2006 | Dwilinski et al. | |
| 2006/0037529 A1 | 2/2006 | D'Evelyn et al. | |
| 2006/0037530 A1 | 2/2006 | Dwilinski et al. | |
| 2006/0038193 A1 | 2/2006 | Wu et al. | |
| 2006/0048699 A1 | 3/2006 | D'Evelyn et al. | |
| 2006/0096521 A1 | 5/2006 | D'Evelyn et al. | |
| 2006/0118799 A1 | 6/2006 | D'Evelyn et al. | |
| 2006/0163589 A1 | 7/2006 | Fan et al. | |
| 2006/0169993 A1 | 8/2006 | Fan et al. | |
| 2006/0177362 A1 * | 8/2006 | D'Evelyn et al. | 422/245.1 |
| 2006/0207497 A1 | 9/2006 | D'Evelyn et al. | |
| 2006/0213429 A1 | 9/2006 | Motoki et al. | |
| 2006/0214287 A1 | 9/2006 | Ogihara et al. | |
| 2006/0228870 A1 | 10/2006 | Oshima | |
| 2006/0246687 A1 | 11/2006 | Kaiser et al. | |
| 2006/0255343 A1 | 11/2006 | Ogihara et al. | |
| 2006/0289386 A1 | 12/2006 | Tysoe et al. | |
| 2007/0015345 A1 | 1/2007 | Baker et al. | |
| 2007/0057337 A1 | 3/2007 | Kano et al. | |
| 2007/0077674 A1 | 4/2007 | Okuyama et al. | |
| 2007/0096239 A1 | 5/2007 | Cao et al. | |
| 2007/0105351 A1 | 5/2007 | Motoki et al. | |
| 2007/0114569 A1 | 5/2007 | Wu et al. | |
| 2007/0121690 A1 | 5/2007 | Fujii et al. | |
| 2007/0131967 A1 | 6/2007 | Kawaguchi et al. | |
| 2007/0141819 A1 | 6/2007 | Park | |
| 2007/0142204 A1 | 6/2007 | Park et al. | |
| 2007/0151509 A1 | 7/2007 | Park | |
| 2007/0158785 A1 | 7/2007 | D'Evelyn et al. | |
| 2007/0164292 A1 | 7/2007 | Okuyama | |
| 2007/0166853 A1 | 7/2007 | Guenther et al. | |
| 2007/0178039 A1 | 8/2007 | D'Evelyn et al. | |
| 2007/0181056 A1 | 8/2007 | D'Evelyn et al. | |
| 2007/0190758 A1 | 8/2007 | Kaeding et al. | |
| 2007/0197004 A1 | 8/2007 | Dadgar et al. | |
| 2007/0210074 A1 | 9/2007 | Maurer et al. | |
| 2007/0215033 A1 | 9/2007 | Imaeda et al. | |
| 2007/0228404 A1 | 10/2007 | Tran et al. | |
| 2007/0234946 A1 | 10/2007 | Hashimoto et al. | |
| 2007/0252164 A1 | 11/2007 | Zhong et al. | |
| 2007/0274359 A1 | 11/2007 | Takeuchi et al. | |
| 2007/0290224 A1 | 12/2007 | Ogawa | |
| 2008/0006831 A1 | 1/2008 | Ng | |
| 2008/0008855 A1 | 1/2008 | D'Evelyn et al. | |
| 2008/0023691 A1 | 1/2008 | Jang et al. | |
| 2008/0025360 A1 | 1/2008 | Eichler et al. | |
| 2008/0073660 A1 | 3/2008 | Ohno et al. | |
| 2008/0083741 A1 * | 4/2008 | Giddings et al. | 219/534 |
| 2008/0083929 A1 | 4/2008 | Fan et al. | |

| | | |
|---|---|---|
| 2008/0087919 A1 | 4/2008 | Tysoe et al. |
| 2008/0106212 A1 | 5/2008 | Yen et al. |
| 2008/0121906 A1 | 5/2008 | Yakushiji |
| 2008/0128752 A1 | 6/2008 | Wu |
| 2008/0156254 A1 | 7/2008 | Dwilinski et al. |
| 2008/0193363 A1 | 8/2008 | Tsuji |
| 2008/0198881 A1 | 8/2008 | Farrell et al. |
| 2008/0211416 A1 | 9/2008 | Negley et al. |
| 2008/0230765 A1 | 9/2008 | Yoon et al. |
| 2008/0272462 A1 | 11/2008 | Shimamoto |
| 2008/0282978 A1 | 11/2008 | Butcher et al. |
| 2008/0285609 A1 | 11/2008 | Ohta et al. |
| 2008/0298409 A1 | 12/2008 | Yamashita et al. |
| 2009/0078955 A1 | 3/2009 | Fan et al. |
| 2009/0092536 A1 | 4/2009 | Kawabata et al. |
| 2009/0146170 A1 | 6/2009 | Zhong et al. |
| 2009/0218593 A1 | 9/2009 | Kamikawa et al. |
| 2009/0250686 A1 | 10/2009 | Sato et al. |
| 2009/0301387 A1 | 12/2009 | D'Evelyn |
| 2009/0301388 A1 | 12/2009 | D'Evelyn et al. |
| 2009/0309110 A1 | 12/2009 | Raring et al. |
| 2009/0320744 A1 | 12/2009 | D'Evelyn et al. |
| 2009/0320745 A1 | 12/2009 | D'Evelyn et al. |
| 2010/0001300 A1 | 1/2010 | Raring et al. |
| 2010/0003492 A1 | 1/2010 | D'Evelyn |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0032691 A1 | 2/2010 | Kim |
| 2010/0108985 A1 | 5/2010 | Chung et al. |
| 2010/0109030 A1 | 5/2010 | Krames et al. |
| 2010/0117101 A1 | 5/2010 | Kim et al. |
| 2010/0117118 A1 | 5/2010 | Dabiran et al. |
| 2010/0147210 A1 | 6/2010 | D'Evelyn |
| 2010/0151194 A1 | 6/2010 | D'Evelyn |
| 2010/0219505 A1 | 9/2010 | D'Evelyn |
| 2010/0295088 A1 | 11/2010 | D'Evelyn et al. |
| 2011/0017298 A1 | 1/2011 | Lee |
| 2011/0100291 A1 | 5/2011 | D'Evelyn |
| 2011/0108081 A1 | 5/2011 | Werthen et al. |
| 2011/0121331 A1 | 5/2011 | Simonian et al. |
| 2011/0175200 A1 | 7/2011 | Yoshida |
| 2011/0183498 A1* | 7/2011 | D'Evelyn ............ 438/478 |
| 2011/0220912 A1 | 9/2011 | D'Evelyn |
| 2011/0256693 A1 | 10/2011 | D'Evelyn et al. |
| 2011/0262773 A1 | 10/2011 | Poblenz et al. |
| 2012/0000415 A1 | 1/2012 | D'Evelyn et al. |
| 2012/0007102 A1 | 1/2012 | Feezell et al. |
| 2012/0073494 A1 | 3/2012 | D'Evelyn |
| 2012/0091465 A1 | 4/2012 | Krames et al. |
| 2012/0118223 A1 | 5/2012 | D'Evelyn |
| 2012/0178215 A1 | 7/2012 | D'Evelyn |
| 2012/0187412 A1 | 7/2012 | D'Evelyn et al. |
| 2012/0199952 A1 | 8/2012 | D'Evelyn et al. |

FOREIGN PATENT DOCUMENTS

| | | |
|---|---|---|
| WO | WO 2005121415 A1 | 12/2005 |
| WO | WO2007-004495 | 1/2007 |
| WO | WO2012-016033 | 2/2012 |

OTHER PUBLICATIONS

Chiang et al. "Luminescent Properties of Cerium-Activated Garnet Series Phosphor: Structure and Temperature Effects," Journal of the Electrochemical Society 155:B517-B520 (2008).

Chiu et al. "Synthesis and Luminescence Properties of Intensely Red-Emitting M5Eu $(WO_4)_{4-x}$ $(MoO_4)_x$ (M= Li, Na, K) Phosphors," Journal of the Electrochemical Society 155:J71-J78 (2008).

Ci et al. "$Ca_{1-x}Mo_{1-y}Nb_yO_4:Eu_x^{3+}$: A novel red phosphor for white light emitting diodes," Physica B 152:670-674 (2008).

Happek "Development of Efficient UV-LED Phosphor Coatings for Energy Saving Solid State Lighting" University of Georgia (Jan. 2007).

Höppe et al. "Luminescence in $Eu^{2+}$-doped $Ba_2Si_5N_8$: fluorescence, thernoluminescence, and upconversion"; Journal of Physics and Chemistry of Solids 61:2001-2006 (2000).

Li et al. "The effect of replacement of Sr by Ca on the structural and luminescence properties of the red-emitting $Sr_2Si_5N_8:Eu_2+$ LED conversion phosphor," Journal of Solid State Chemistry 181:515-524 (2008).

Mueller-Mach et al. "Highly efficient all-nitride phosphor-converted white light emitting diode," Physica Status Solidi (a) 202:1727-1732 (Jul. 2005).

Setlur et al. "Crystal chemistry and luminescence of $Ce^{3+}$-doped $(Lu_2CaMg_2)$-Ca-2(Si, Ge)$_3O_{12}$ and its use in LED based lighting," Chemistry of Materials 18: 3314-3322 (2006).

Wang et al. "New red $Y_{0.85}Bi_{0.1}Eu_{0.05}V_{1-y}M_yO_4$ (M=Nb, P) phosphors for light-emitting diodes," Physica B: Condensed Matter 403:2071-2075 (Jun. 2008).

Yamamoto "White LED phosphors: the next step," Proceeding of. SPIE (2010).

Yang et al. "Preparation and luminescence properties of LED conversion novel phosphors $SrZnO_2:Sm$," Materials Letters 62:907-910 (Mar. 2008).

Byrappa et al., "Handbook of Hydrothermal Technology: A Technology for Crystal Growth and Materials Processing," Noyes Publications, Park Ridge, New Jersey, 2001, pp. 94-96 and 152.

Callahan et al., "Synthesis and Growth of Gallium Nitride by the Chemical Vapor Reaction Process (CVRP)," 1999, MRS Internet Journal Nitride Semiconductor Research, vol. 4, Issue No. 10, pp. 1-6.

D'Evelyn et al., "Bulk GaN Crystal Growth by the High-Pressure Ammonothermal Method," Journal of Crystal Growth, 2007, vol. 300, pp. 11-16.

Dwilinski et al, AMMONO Method of BN, AlN, and GaN Synthesis and Crystal Growth,: Journal of Nitride Semiconductor Research, 1998, 3,25, MRS, Internet: http://nsr.mij.mrs.org.

Dwilinski et al., "Excellent Crystallinity of Truly Bulk Ammonothermal GaN," Journal of Crystal Growth, 2008, vol. 310, pp. 3911-3916.

Ehrentraut et al., "Prospects for the Ammonothermal Growth of Large GaN Crystal," Journal of Crystal Growth, 2007, vol. 305, pp. 304-310.

Farrell et al., "Continuous-wave Operation of AlGaN-cladding-free Nonpolar m-Plane InGaN/GaN Laser Diodes," 2007, Japanese Journal of Applied Physics, vol. 46, No. 32, pp. L761-L763.

Feezell et al., "AlGaN-Cladding-Free Nonpolar InGaN/GaN Laser Diodes," Japanese Journal of Applied Physics, vol. 46, No. 13, pp. L284-L286.

Frayssinet et al., "Evidence of Free Carrier Concentration Gradient Along the c-axis for Undoped GaN Single Crystals," Journal of Crystal Growth, 2001, vol. 230, pp. 442-447.

Hashimoto et al. "Ammonothermal growth of bulk GaN," Journal of Crystal Growth 310:3907-3910 (Aug. 2008).

Hashimoto et al. "A GaN bulk crystal wit improved structural quality grown by the ammonothermal method," Nature Materials 6:568-671 (Jul. 2007).

Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.

Kim et al, "Improved Electroluminescence on Nonpolar m-plane InGaN/GaN Qantum Well LEDs", 2007, Physica Status Solidi (RRL), vol. 1, No. 3, pp. 125-127.

Kojima et al., "Stimulated Emission at 474 nm from an InGaN Laser Diode Structure Grown on a (1122) GaN Substrate ," 2007, Applied Physics Letter, vol. 91, No. 25, pp. 251107-251107-3.

Kolis et al., "Crystal Growth of Gallium Nitride in Supercritical Ammonia," Journal of Crystal Growth, 2001, vol. 222, pp. 431-434.

Kolis et al., "Materials Chemistry and Bulk Crystal Growth of Group III Nitrides in Supercritical Ammonia" Mat. Res. Soc. Symp. Proc., 1998, vol. 495, pp. 367-372.

Kubota et al., "Temperature Dependence of Polarized Photoluminescence from Nonpolar m-plane InGaN Multiple Quantum Wells for Blue Laser Diodes" 2008, Applied Physics Letter, vol. 92, pp. 011920-011920-3.

Mirwald et al., "Low-Friction Cell for Piston-Cylinder High Pressure Apparatus," Journal of Geophysical Research, 1975, vol. 80, No. 11, pp. 1519-1525.

Motoki et al. "Growth and Characterization of Freestanding GaN Substrates," Journal of Crystal Growth, 2002, vol. 237-239, pp. 912-921.

Murota et al., "Solid State Light Source Fabricated with YAG:Ce Single Crystal," 2002, Japanese Journal of Applied Physics, vol. 46, No. 41, Part 2, No. 8A, pp. L887-L888.

Okamoto et al., "Continuous-Wave Operation of m-Plane InGaN Multiple Quantum Well Laser Diodes," 2007, Japanese Journal of Applied Physics, vol. 46, No. 9, pp. L187-L189.

Okamoto et al., "Pure Blue Laser Diodes Based on Nonpolar m-Plane Gallium Nitride with InGaN Waveguiding Layers," 2007, Japanese Journal of Applied Physics, vol. 46, No. 35, pp. L820-L822.

Oshima et al., "Thermal and Optical Properties of Bulk GaN Crystals Fabricated Through Hydride Vapor Phase Epitaxy with Void-Assisted Separation," 2005, Journal of Applied Physics, vol. 98, pp. 103509-1-103509-3.

Peters, "Ammonothermal Synthesis of Aluminium Nitride," Journal of Crystal Growth, 1999, vol. 4, pp. 411-418.

Sato et al., "High Power and High Efficiency Green Light Emitting Diode on free-Standing Semipolar (1122) Bulk GaN Substrate," 2007.Physica Status Solidi (RRL), vol. 1, pp. 162-164.

Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.

Schmidt et al., "Demonstration of Nonpolar m-Plane InGaN/GaN Laser Diodes ," 2007, Japanese Journal of Applied Physics, vol. 46, No. 9, L190-L191.

Sizov et al., "500-nm Optical Gain Anisotropy of Semipolar (1122) InGaN Quantum Wells," 2009, Applied Physics Express, vol. 2, pp. 071001-1-071001-3.

Tsuda et al., "Blue Laser Diodes Fabricated on *m*-Plane GaN Substrates," 2008, Applied Physics Express, vol. 1, pp. 011104-011104-03.

Tyagi et al., "Semipolar (1011) InGaN/GaN Laser Diodes on Bulk GaN Substrates," 2007, Japanese Journal of Applied Physics, vol. 46, No. 19, pp. L444-L445.

Wang et al. "Ammonothermal growth of GaN crystals in alkaline solutions," Journal of crystal Growth 287:376-380 (Jan. 2006).

Wang et al., "Ammonothermal Synthesis of III-Nitride Crystals," Crystal Growth & Design, 2006, vol. 6, Issue No. 6, pp. 1227-1246.

Wang et al., "Synthesis of Dense Polycrystaline GaN of High Purity by the Chemical Vapor Reaction Process," Journal of Crystal Growth, 2006, vol. 286, pp. 50-54.

Zhong et al., "Demonstration of High Power Blue-Green Light Emitting Diode on Semipolar (1122) Bulk GaN Substrate," 2007, Electron Letter, vol. 43, No. 15, pp. 825-826.

Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.

Office action for U.S. Appl. No. 12/497,969 (Feb. 2, 2012).
Office action for U.S. Appl. No. 12/478,736 (Feb. 7, 2012).
Office action for U.S. Appl. No. 12/569,841 (Dec. 23, 2011).
Office action for U.S. Appl. No. 12/724,983 (Mar. 5, 2012).
Office action for U.S. Appl. No. 12/785,404 (Mar. 6, 2012).
Office action for U.S. Appl. No. 12/491,176 (Mar. 1, 2012).

Fukuda et al. "Prospects for the ammonothermat growth of large GaN crystal," Journal of Crystal Growth 305: 304-310 (Jul. 2007).

International Search Report of PCT Application No. PCT/US2009/48=189, dated Sep. 14, 2009, 3 pages total.

Lide et al., 'Thermal Conductivity of Ceramics and Other Insulating Materials,' CRC Handbook of Chemistry and Physics, 91st Edition, 2010-2011, pp. 12-203 and 12-204.

Pattison et al., 'Gallium Nitride Based Microcavity Light Emitting Diodes With 2λ Effective Cavity Thickness', Applied Physics Letters, vol. 90, Issue 3, 031111 (2007) 3pg.

USPTO Office Action for U.S. Appl. No. 12/133,364 dated Nov. 26, 2010.
USPTO Office Action for U.S. Appl. No. 12/133,364 dated Jun. 1, 2011.
USPTO Notice of Allowance for U.S. Appl. No. 12/133,364 dated Oct. 11, 2011.
USPTO Office Action for U.S. Appl. No. 12/133,365 dated Jun. 9, 2011.
USPTO Office Action for U.S. Appl. No. 12/133,365 dated Oct. 18, 2011.
USPTO Office Action for U.S. Appl. No. 12/334,418 dated Apr. 5, 2011.
USPTO Office Action for U.S. Appl. No. 12/334,418 dated Oct. 19, 2011.
USPTO Office Action for U.S. Appl. No. 12/478,736 dated Sep. 27, 2011.
USPTO Notice of Allowance for U.S. Appl. No. 12/478,736 dated Apr. 23, 2012.
USPTO Office Action for U.S. Appl. No. 12/484,095 dated Nov. 10, 2010.
USPTO Office Action for U.S. Appl. No. 12/484,095 dated Jul. 8, 2011.
USPTO Office Action for U.S. Appl. No. 12/534,838 dated May 3, 2011.
USPTO Office Action for U.S. Appl. No. 12/534,838 dated Jan. 13, 2012.
USPTO Office Action for U.S. Appl. No. 12/534,838 dated Mar. 20, 2012.
USPTO Notice of Allowance for U.S. Appl. No. 12/534,838 dated Jun. 8, 2012.
USPTOo Office Action for U.S. Appl. No. 12/534,844 dated Sep. 16, 2010.
USPTO Office Action for U.S. Appl. No. 12/534,844 dated Feb. 4, 2011.
USPTO Office Action for U.S. Appl. No. 12/534,857 dated Sep. 1, 2010.
USPTO Notice of Allowance for U.S. Appl. No. 12/534,857 dated May 27, 2011.
USPTO Office Action for U.S. Appl. No. 12/546,458 dated Jul. 20, 2011.
USPTO Notice of Allowance for U.S. Appl. No. 12/546,458 dated Nov. 28, 2011.
USPTO Office Action for U.S. Appl. No. 12/556,558 dated Sep. 16, 2010.
USPTO Notice of Allowance for U.S. Appl. No. 12/556,558 dated Mar. 22, 2011.
USPTO Office Action for U.S. Appl. No. 12/556,562 dated Sep. 15, 2010.
USPTO Office Action for U.S. Appl. No. 12/556,562 dated Mar. 21, 2011.
USPTO Notice of Allowance for U.S. Appl. No. 12/556,562 dated Jul. 27, 2011.
USPTO Office Action for U.S. Appl. No. 12/569,337 dated May 9, 2012.
USPTO Office Action for U.S. Appl. No. 12/634,665 dated Apr. 25, 2012.
USPTO Notice of Allowance for U.S. Appl. No. 12/754,886 dated May 17, 2012.
USPTO Notice of Allowance for U.S. Appl. No. 12/754,886 dated Jun. 5, 2012.
USPTO Notice of Allowance for U.S. Appl. No. 12/754,886 dated Jun. 20, 2012.
Sarva et al. "Dynamic compressive strength of silicon carbide under uniaxial compression," Mat. Sci. & Eng. A 317,140 (2001).
USPTO Office Action for U.S. Appl. No. 12/497,969 dated Jul. 5, 2012.
USPTO Office Action for U.S. Appl. No. 12/534,843 dated Sep. 10, 2012.
USPTO Notice of Allowance for U.S. Appl. No. 12/534,849 dated Jul. 31, 2012.
USPTO Notice of Allowance for U.S. Appl. No. 12/785,404 dated Jul. 16, 2012.
USPTO Office Action for U.S. Appl. No. 13/179,346 dated Aug. 17, 2012.
USPTO Notice of Allowance for U.S. Appl. No. 13/425,304 dated Aug. 22, 2012.
http://www.matbase.com/material/non-ferrous-metals/other/molybdenum/properties, Data Table for: Non-Ferrous Metals: Other Metals: Molybdenum; Mar. 28, 2011.

Choi et al., '2.51 microcavity InGaN light-emitting diodes fabricated by a selective dry-etch thinning process', Applied Physics Letters, 2007, 2007, 91(6), 061120.

Weisbuch et al., 'Recent results and latest views on microactivity LEDs', Light-Emitting Diodes: Researh, Manufacturing, and Applications VIII, ed. By S.A. Stockman et al., Proc. SPIE, vol. 5366, p. 1-19 (2004).

USPTO Notice of Allowance for U.S. Appl. No. 12/478,736 dated Oct. 9, 2012.

USPTO Notice of Allowance for U.S. Appl. No. 12/569,337 dated Nov. 15, 2012.

USPTO Office Action for U.S. Appl. No. 12/569,844 dated Oct. 12, 2012.

USPTO Office Action for U.S. Appl. No. 12/634,665 dated Oct. 1, 2012.

USPTO Office Action for U.S. Appl. No. 13/025,833 dated Jul. 12, 2012.

USPTO Office Action for U.S. Appl. No. 13/041,199 dated Nov. 30, 2012.

USPTO Office Action for U.S. Appl. No. 13/175,739 dated Dec. 7, 2012.

USPTO Office Action for U.S. Appl. No. 13/179,346 dated Dec. 13, 2012.

USPTO Office Action for U.S. Appl. No. 13/226,249 dated Oct. 10, 2012.

* cited by examiner 101
103
105
107

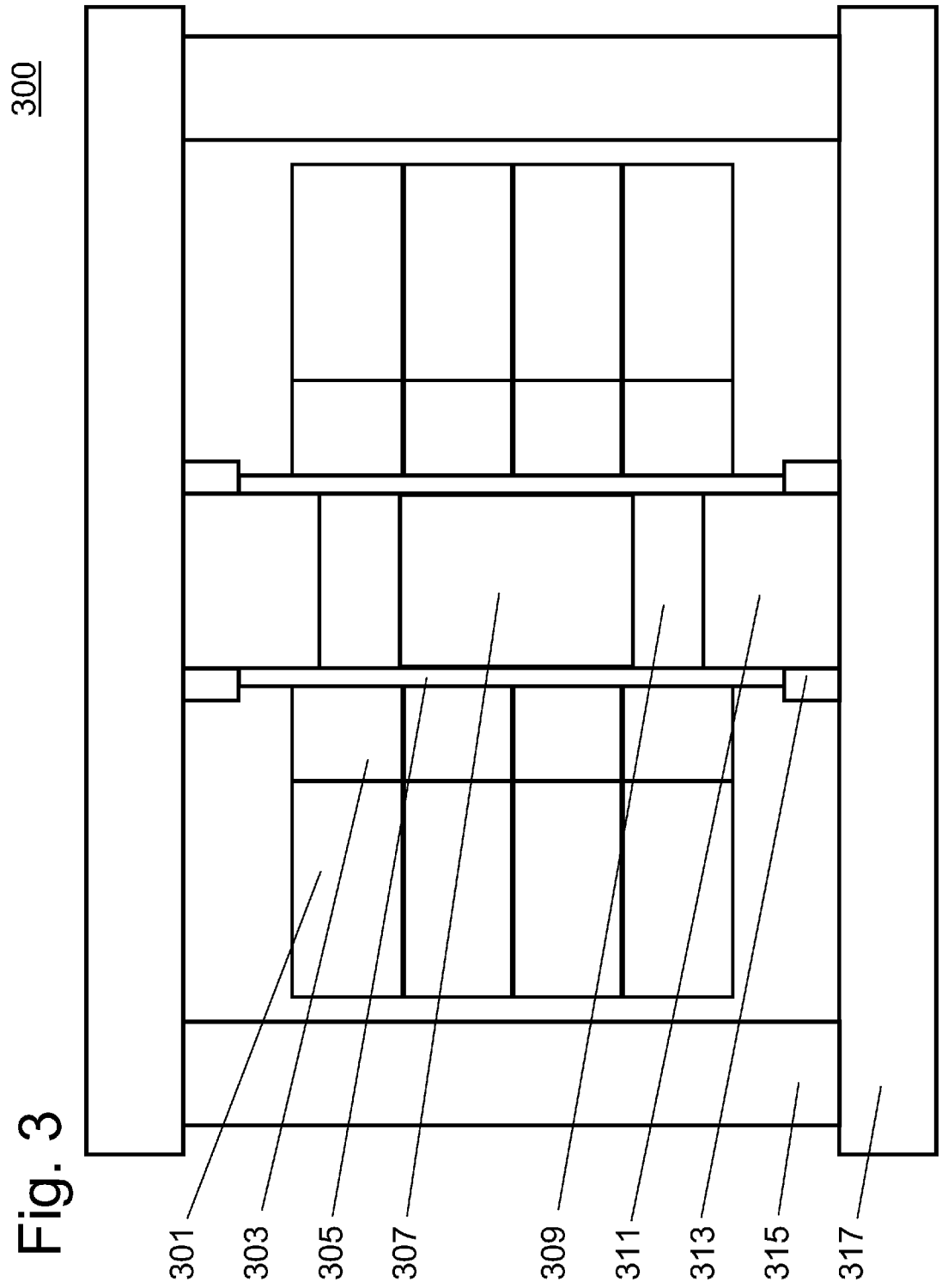

HIGH PRESSURE APPARATUS WITH STACKABLE RINGS

CROSS-REFERENCE TO RELATED APPLICATION

This application claims priority to U.S. Provisional Application No. 61/246,650, filed Sep. 29, 2009, commonly assigned, and incorporate by reference in its entirety for all purposes.

BACKGROUND OF THE INVENTION

This invention relates generally to techniques for processing materials in supercritical fluids. More specifically, embodiments of the invention include techniques for controlling parameters associated with a material processing capsule disposed within a high-pressure apparatus enclosure. Merely by way of example, the invention can be applied to growing crystals of GaN, AlN, InN, InGaN, AlGaN, AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, transistors, and other devices.

Supercritical fluids are used to process a wide variety of materials. A supercritical fluid is often defined as a substance beyond its critical point, i.e., critical temperature and critical pressure. A critical point represents the highest temperature and pressure at which the substance can exist as a vapor and liquid in equilibrium. In certain supercritical fluid applications, the materials being processed are placed inside a pressure vessel or other high pressure apparatus. In some cases it is desirable to first place the materials inside a container, liner, or capsule, which in turn is placed inside the high pressure apparatus. In operation, the high pressure apparatus provides structural support for the high pressures generated within the container or capsule holding the materials. The container, liner, or capsule provides a closed/sealed environment that is chemically inert and impermeable to solvents, solutes, and gases that may be involved in or generated by the process.

Scientists and engineers have been synthesizing crystalline materials using high pressure techniques. As an example, synthetic diamonds are often made using high pressure and temperature conditions. Synthetic diamonds are often used for industrial purposes but can also be grown large enough for jewelry and other applications. Scientists and engineers also use high pressure to synthesize complex materials such as zeolites, which can be used to filter toxins and the like. Moreover, geologists have also used high pressure techniques to simulate conditions and/or processes occurring deep within the earth's crust. High pressure techniques often rely upon supercritical fluids, herein referred to as SCFs.

Supercritical fluids provide an especially ideal environment for growth of high quality crystals in large volumes and low costs. In many cases, supercritical fluids possess the solvating capabilities of a liquid with the transport characteristics of a gas. Thus, on the one hand, supercritical fluids can dissolve significant quantities of a solute for recrystallization. On the other hand, the favorable transport characteristics include a high diffusion coefficient, so that solutes may be transported rapidly through the boundary layer between the bulk of the supercritical fluid and a growing crystal, and also a low viscosity, so that the boundary layer is very thin and small temperature gradients can cause facile self-convection and self-stirring of the reactor. This combination of characteristics enables, for example, the growth of hundreds or thousands of large $\alpha$-quartz crystals in a single growth run in supercritical water.

Supercritical fluids also provide an attractive medium for synthesis of exotic materials, such as zeolites, for solvent extractions, as of caffeine from coffee, and for decomposition and/or dissolution of materials that are relatively inert under more typical conditions, such as biofuels and toxic waste materials.

In some applications, such as crystal growth, the pressure vessel or capsule also includes a baffle plate that separates the interior into different chambers, e.g., a top half and a bottom half. The baffle plate typically has a plurality of random or regularly spaced holes to enable fluid flow and heat and mass transfer between these different chambers, which hold the different materials being processed along with a supercritical fluid. For example, in typical crystal growth applications, one portion of the capsule contains seed crystals and the other half contains nutrient material. In addition to the materials being processed, the capsule contains a solid or liquid that forms the supercritical fluid at elevated temperatures and pressures and, typically, also a mineralizer to increase the solubility of the materials being processed in the supercritical fluid. In other applications, for example, synthesis of zeolites or of nanoparticles or processing of ceramics, no baffle plate may be used for operation. In operation, the capsule is heated and pressurized toward or beyond the critical point, thereby causing the solid and/or liquid to transform into the supercritical fluid. In some applications the fluid may remain subcritical, that is, the pressure or temperature may be less than the critical point. However, in all cases of interest here, the fluid is superheated, that is, the temperature is higher than the boiling point of the fluid at atmospheric pressure. The term "supercritical" will be used throughout to mean "superheated", regardless of whether the pressure and temperature are greater than the critical point, which may not be known for a particular fluid composition with dissolved solutes.

Although somewhat effective for conventional crystal growth, drawbacks exist with conventional processing vessels. As an example, processing capabilities for conventional steel hot-wall pressure vessels (e.g., autoclaves) are typically limited to a maximum temperature of about 400 Degrees Celsius and a maximum pressure of 0.2 GigaPascals (GPa). Fabrication of conventional pressure vessels from nickel-based superalloys allows for operation at a maximum temperature of about 550 degrees Celsius and a maximum pressure of about 0.5 GPa. Therefore, these conventional hot-wall pressure vessels are often inadequate for some processes, such as the growth of gallium nitride crystals in supercritical ammonia that often require pressures and temperatures that extend significantly above this range in order to achieve growth rates above about 2-4 microns per hour. In addition, nickel-based superalloys are very expensive and are difficult to machine, limiting the maximum practical size and greatly increasing the cost compared to traditional steel pressure vessels.

Attempts have been made to overcome the drawbacks of conventional pressure vessels. D'Evelyn et al., US patent application 2003/0140845A1, indicates a so-called zero-stroke high pressure apparatus adapted from the type of belt apparatus used for synthesis of diamond using high pressure and high temperature. Cemented tungsten carbide, however, is used as the die material, which is relatively expensive and is difficult to manufacture in large dimensions. In addition, the use of a hydraulic press to contain the apparatus increases the cost and further limits the maximum volume. Finally, the use of a pressure transmission medium surrounding the capsule used to contain the supercritical fluid reduces the volume available within the hot zone for processing material.

D'Evelyn et al., US patent application 2006/0177362A1, indicates several types of apparatus with capability for pressures and temperatures well in excess of that of conventional autoclaves and with improved scalability relative to the zero-stroke press apparatus described above. A series of wedge-shaped radial ceramic segments are placed between a heater which surrounds a capsule and a high-strength enclosure, in order to reduce both the pressure and temperature to which the inner diameter of the high-strength enclosure is exposed compared to the corresponding values for the capsule. Fabrication and use of these ceramic wedge-shaped radial segments, however, can be difficult and expensive, and the maximum volume may be limited. These and other limitations of conventional apparatus may be described throughout the present specification.

From the above, it is seen that techniques for improving a high pressure apparatus for crystal growth is highly desirable.

BRIEF SUMMARY OF THE INVENTION

According to the present invention, techniques related for processing materials in supercritical fluids are provided. More specifically, embodiments of the invention include techniques for controlling parameters associated with a material processing capsule disposed within a high-pressure apparatus/enclosure. Merely by way of example, the invention can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting and hydrogen generation, photodetectors, integrated circuits, and transistors, and others.

In a specific embodiment, the present invention provides a high pressure apparatus and related methods for processing supercritical fluids. In a specific embodiment, the present apparatus includes a capsule, a heater, at least one ceramic ring but can be multiple rings, optionally, with one or more scribe marks and/or cracks present. In a specific embodiment, the apparatus optionally has a metal sleeve containing each ceramic ring. The apparatus also has a high-strength enclosure, end flanges with associated insulation, and a power control system. The apparatus is scalable up to very large volumes and is cost effective. In a specific embodiment, the apparatus is capable of accessing pressures and temperatures of 0.2-2 GPa and 400-1200° C., respectively. As used herein in a specific embodiment, the term "high-strength" generally means suitable mechanical and other features (e.g., tensile strength, Young's Modulus, yield strength, toughness, creep resistance, chemical resistance) that allow for use as a high pressure enclosure, such as a pressure vessel, which may be airtight, but may also not be air and/or gas tight). As an example, the term "high pressure" generally refers to above 0.1 GPa, 0.2 GPa, 0.5 GPa, and others, particularly in pressures suitable for growth of crystalline materials, including but not limited to GaN, AlN, InN, AlGaN, InGaN, AlInGaN, and other nitrides or oxides or metal or dielectric or semiconducting materials. In a specific embodiment, the high strength enclosure material is provided to form a high strength enclosure configured to withstand a load of greater than about 0.1 GPa (or 0.2 GPa or 0.5 GPa) for a predetermined time period at a temperature of about 200 Degrees Celsius or less. Of course, there can be other variations, modifications, and alternatives.

In an alternative specific embodiment, the present invention provides apparatus for high pressure crystal or material processing, e.g., GaN, AlN, InN, InGaN, AlGaN, and AlInGaN. The apparatus includes a cylindrical capsule region comprising a first region and a second region, and a length defined between the first region and the second region. The apparatus has an annular heating member enclosing the cylindrical capsule region. The apparatus has at least one continuous annular ceramic (or metal or cermet) member having a predetermined thickness disposed continuously around a perimeter of the annular heating member. In a specific embodiment, the continuous annular member is made of a material having a compressive strength of about 0.5 GPa and greater and a thermal conductivity of about 4 watts per meter-Kelvin and less. In a specific embodiment, the apparatus has a high strength enclosure material disposed overlying the annular ceramic member.

Still further, the present invention provides a method of crystal growth, e.g., GaN, AlN, InN, InGaN, AlGaN, and AlInGaN. The method includes providing an apparatus for high pressure crystal growth or material processing. The apparatus includes a cylindrical capsule region comprising a first region and a second region, and a length defined between the first region and the second region. The apparatus also has an annular heating member enclosing the cylindrical capsule region. The apparatus has at least one continuous ceramic or annular metal or cermet member having a predetermined thickness disposed continuously around a perimeter of the annular heating member. In a preferred embodiment, the continuous annular member is made of a material having a compressive strength of about 0.5 GPa and greater and a thermal conductivity of about 4 watts per meter-Kelvin and less. The apparatus also has a high strength enclosure material disposed overlying the annular ceramic member. In a specific embodiment, the method also includes providing a capsule containing a solvent and placing the capsule within an interior region of the cylindrical capsule region. In a specific embodiment, the method includes processing the capsule with thermal energy to cause an increase in temperature within the capsule to greater than 200 Degrees Celsius to cause the solvent to be superheated.

Moreover, depending upon the embodiment, the present method can also include one of a plurality of optional steps. Optionally, the method includes forming a crystalline material from a process of the superheated solvent. Additionally, the method includes removing thermal energy from the capsule to cause a temperature of the capsule to change from a first temperature to a second temperature, which is lower than the first temperature. The method also includes removing a first flange and a second flange from the high pressure apparatus and moving a mechanical member, using a hydraulic drive force, from the first region of the cylindrical capsule region toward the second region to transfer the capsule out of the cylindrical capsule region. In a preferred embodiment, the present apparatus can be scaled up in size to a capsule volume of 0.3 liters, to about 300 liters and greater.

Benefits are achieved over pre-existing techniques using the present invention. In particular, the present invention enables a cost-effective high pressure apparatus for growth of crystals such as GaN, AlN, InN, InGaN, and AlInGaN and others. In a specific embodiment, the present method and apparatus can operate with components that are relatively simple and cost effective to manufacture, such as ceramic and steel tubes. A specific embodiment also takes advantage of the one or more cracks provided in the ceramic member, which insulates the heater. Depending upon the embodiment, the present apparatus and method can be manufactured using conventional materials and/or methods according to one of ordinary skill in the art. The present apparatus and method enable cost-effective crystal growth and materials processing under extreme pressure and temperature conditions in batch volumes larger than 0.3 liters, larger than 1 liter, larger than 3 liters, larger than 10 liters, larger than 30 liters, larger than 100 liters, and larger than 300 liters according to a specific embodiment. These and other benefits may be described throughout the present specification and more particularly below.

A further understanding of the nature and advantages of the present invention is described below and in the attached drawings.

BRIEF DESCRIPTION OF THE DRAWINGS

FIG. 3 is a simplified side view diagram of a high pressure apparatus according to an embodiment of the present invention.

DETAILED DESCRIPTION OF THE INVENTION

This invention provides techniques for processing materials in supercritical fluid. Embodiments of the invention include techniques for controlling parameters associated with a material processing capsule disposed within a high-pressure apparatus/enclosure. In a specific embodiment, the invention provides a high pressure apparatus for processing materials. Depending upon the embodiment, the apparatus has been described with reference to a specific orientation relative to the direction of gravity. The apparatus is described as being vertically oriented. In another embodiment, the apparatus is instead horizontally oriented, or oriented at an oblique angle, intermediate between vertical and horizontal. In addition, the apparatus may be rocked so as to facilitate convection of the supercritical fluid within the capsule.

Figure 1:
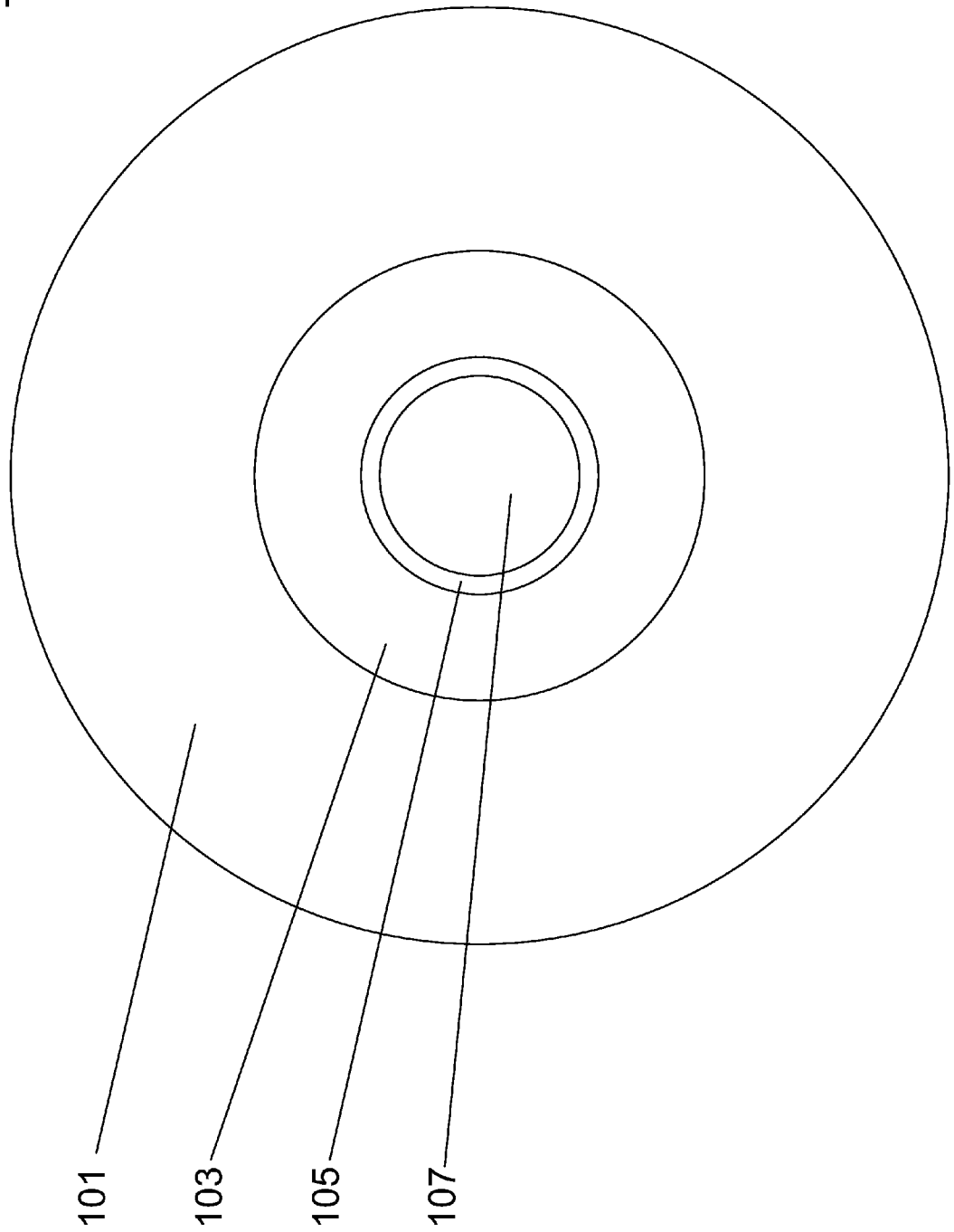
FIG. 1 is a simplified cross-sectional view diagram of a high pressure apparatus according to an embodiment of the present invention.

FIG. 1 is a simplified cross-sectional view diagram of a high pressure apparatus according to an embodiment of the invention. As shown, the invention provides an apparatus for high pressure crystal or material processing, e.g., GaN, AlN, InN, InGaN, AlGaN, and AlInGaN. Other processing methods include hydrothermal crystal growth of oxides and other crystalline materials, hydrothermal or ammonothermal syntheses, and hydrothermal decomposition, and others.

Referring to FIG. 1, high pressure apparatus 100 and related methods for processing materials in supercritical fluids are disclosed. In a specific embodiment, apparatus 100 includes a capsule 107, a heating member or heater 105, and at least one ceramic ring 103, but there can be multiple rings. The apparatus also has a high-strength enclosure 101, which may comprise a metal ring. The apparatus is scalable up to very large volumes and is cost effective. In a specific embodiment, the apparatus is capable of accessing pressures and temperatures of 0.2-2 GPa and 400-1200° C., respectively.

In a specific embodiment, the apparatus has at least one annular ceramic or metal or cermet member or ring 103 having a predetermined thickness disposed continuously around a perimeter of the annular heating member. The continuous annular member is made from material having a compressive strength of about 0.5 GPa and greater, and a thermal conductivity of about 4 watts per meter-Kelvin and less. For example, the ceramic material can comprise a rare earth metal oxide, zirconium oxide, hafnium oxide, magnesium oxide, calcium oxide, aluminum oxide, yttrium oxide, sialon (Si—Al—O—N), silicon nitride, silicon oxynitride, garnets, cristobalite, and mullite. The ceramic material may be a composite, comprising more than one phase. Alternatively, as an example, the metal can be a refractory metal such as tungsten, molybdenum, TZM alloy, and others. The cermet can be cobalt-cemented tungsten carbide, and others. In a specific embodiment, the annular member is one of a plurality of members, which are stacked on top of each other.

The ceramic ring preferably has an inner diameter between 0.5 inch and 24 inches, an outer diameter between 1 inch and 48 inches, and a height between 1 inch and 96 inches. In a specific embodiment, the inner diameter is between about 1.5 inches and about 8 inches and the height is between 0.5 inch and 8 inches. The ratio between the outer diameter and the inner diameter of the rings is preferably between 1.05 and 60, but more preferably between about 1.5 and about 3. Also preferably the ring may has a density greater than 95% of theoretical density. The modulus of rupture of the ring material is preferably greater than 200 MPa, and more preferably greater than 450 MPa. The fracture toughness of the ring material is preferably greater than 9 MPa-m$^{1/2}$. Depending on the dimensions of the rings and of the high-strength enclosure, two to 200 rings may be stacked on top of one another.

In a specific embodiment, the apparatus has a high strength enclosure material 101 disposed overlying the annular ceramic member or ring 103. In a specific embodiment, the high strength enclosure is made of a suitable material to house internal contents including a capsule, a heater, and other elements. In a specific embodiment, the high strength enclosure is made of a material selected to be one or a combination of materials selected from steel, low-carbon steel, SA723 steel, SA266 carbon steel, 4340 steel, A-286 steel, iron based superalloy, 304 stainless steel, 310 stainless steel, 316 stainless steel, 340 stainless steel, 410 stainless steel, 17-4 precipitation hardened stainless steel, zirconium and its alloys, titanium and its alloys, and other materials commonly known as Monel®, Inconel®, Hastelloy®, Udimet 500®, Stellite®, Rene 41™, and Rene 88™. In a preferred embodiment, the high strength enclosure comprises a material with ultimate tensile strength and yield strength characteristics so as to be rated by the American Society of Mechanical Engineers for continuous operation as a pressure vessel at a pressure higher than 50,000 pounds per square inch.

High strength enclosure ring 101 may be assembled onto ceramic ring 103 with an interference shrink. That is, the inner diameter of high strength enclosure ring 101 may be less than the outer diameter of ceramic ring 103 prior to assembly. The magnitude of the interference, that is, the ratio of the interference shrink to the outer diameter of the ceramic ring, may be less than 0.1%, between about 0.1% and about 1%, between about 0.2% and about 0.6%, or greater than 1%. Assembly of high strength enclosure ring 101 over ceramic ring 103 may be accomplished by heating high strength enclosure ring 101 to a temperature between about 100 degrees Celsius and about 1000 degrees Celsius, causing it to expand thermally, and insertion or pressing of ceramic ring 103 into the inner diameter of high strength enclosure ring 101. After assembly, the top and bottom of the ring assembly may be precision ground to provide smooth, flat, accurately parallel surfaces.

Figure 2:
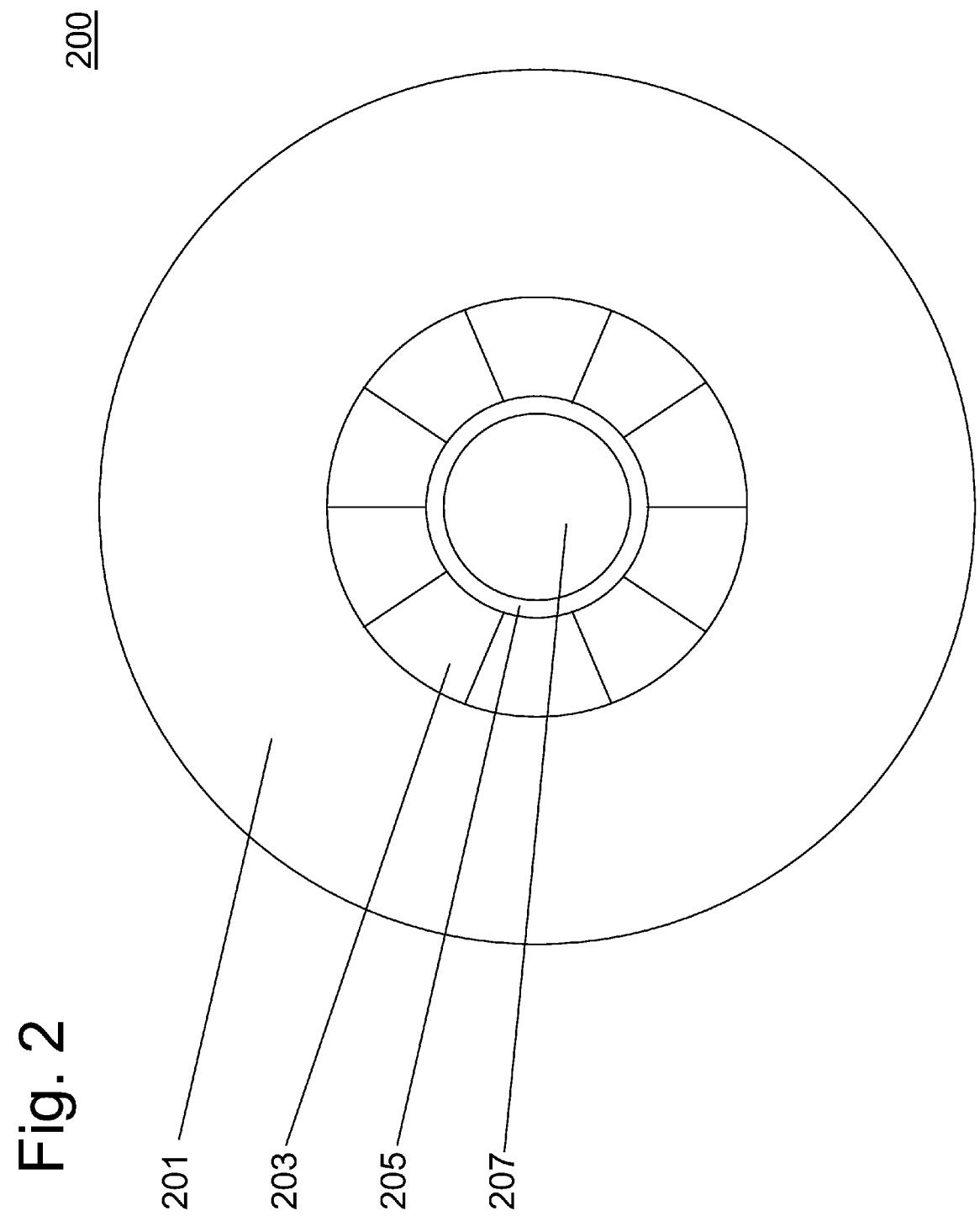
FIG. 2 is a simplified cross-sectional view diagram of a high pressure apparatus according to an embodiment of the present invention.

In an alternative embodiment, shown schematically in FIG. 2, ceramic ring 203, a component of apparatus 200, comprises a plurality of radial segments. These radial segments are disposed one after another around a circumference of capsule 207 and heating member 205, such that each radial segment is a wedge-shaped portion of a segmented cylinder. The radial segment may comprise a ceramic, such as alumina, silicon nitride, silicon carbide, zirconia, or the like. The radial segment may alternatively comprise a refractory metal, such as tungsten, molybdenum, or TZM alloy, or a cermet, such as Co-cemented tungsten carbide. The radial segments are enclosed within high strength enclosure 201.

In a specific embodiment, a spacer, with a thickness between 0.001 inch and 0.1 inch, may be placed between successive rings in the stack to allow for thermal expansion. A sleeve may be placed around one or more ceramic rings. The sleeve may comprise steel or other suitable material according to a specific embodiment. The sleeve may be between 0.020 inch and 0.5 inch thick, and their height may be between 0.25 inch less than that of the ring and 0.1 inch greater than that of the ring depending upon the embodiment. Of course, there can be other variations, modifications, and alternatives.

In a specific embodiment, heater 105 or 205, in apparatus 100 or 200, respectively, comprises at least one hot zone and optionally more. Examples of suitable heaters are described in U.S. patent application 2008/0083741A1 and U.S. patent application Ser. Nos. 61/075,723 and 12/484,095, which are hereby incorporated by reference in their entirety.

In an embodiment, the capsule suitable for insertion inside the heater is formed from a precious metal. Examples of precious metals include platinum, palladium, rhodium, gold, or silver. Other metals can include titanium, rhenium, copper, stainless steel, zirconium, tantalum, alloys thereof, and the like. Examples of suitable capsules are described in U.S. Pat. No. 7,125,453 and in U.S. patent application Ser. No. 12/133,365, which are hereby incorporated by reference in their entirety.

A side view of apparatus 300 is shown in FIG. 3. The apparatus comprises a stack of two or more ring assemblies, comprising a high strength enclosure ring 301 and a ceramic ring 303. The stack may include greater than 2, greater than 5, greater than 10, greater than 20, greater than 30, greater than 50, or greater than 100 ring assemblies. The stack surrounds heater 305 and capsule 307 and may be supported mechanically by at least one support plate (not shown). The stack may provide radial confinement for pressure generated within capsule 307 and transmitted outward through heater 305.

Axial confinement of pressure generated within capsule 307 may be provided by end plugs 311, end flanges 317, and fasteners 315. End plugs 311 may comprise zirconium oxide or zirconia. Alternative end plug materials may include magnesium oxide, aluminum oxide, silicon oxide, silicon carbide, tungsten carbide, steel, nickel alloys, salts, and phyllosilicate minerals such as aluminum silicate hydroxide or pyrophyllite according to a specific embodiment. End plugs 311 may be surrounded by end plug jackets 313. End plug jackets may provide mechanical support and/or radial confinement for end plugs 311. End plug jackets may also provide mechanical support and/or axial confinement for heater 305. End plug jackets may comprise steel, stainless steel, an iron-based alloy, a nickel-based alloy, or the like.

End flanges 317 and fasteners 315 may comprise a material selected from a group consisting of steel, low-carbon steel, SA723 steel, SA266 carbon steel, 4340 steel, A-286 steel, iron based superalloy, 304 stainless steel, 310 stainless steel, 316 stainless steel, 340 stainless steel, 410 stainless steel, 17-4 precipitation hardened stainless steel, zirconium and its alloys, titanium and its alloys, and other materials commonly known as Monel®, Inconel®, Hastelloy®, Udimet 500®, Stellite®, Rene 41™, and Rene 88™.

Apparatus 300 may include a pressure transmission medium 309 proximate to the axial ends of capsule 307 and to end caps 311 according to a specific embodiment. The pressure transmission medium may comprise sodium chloride, other salts, or phyllosilicate minerals such as aluminum silicate hydroxide or pyrophyllite or other materials according to a specific embodiment.

The illustrated apparatus 300 can be used to grow crystals under pressure and temperature conditions desirable for crystal growth, e.g., gallium nitride crystals under related process conditions. The high-pressure apparatus 300 can include one or more structures operable to support the heater 305 radially, axially, or both radially and axially. The support structure in one embodiment thermally insulates the apparatus 300 from the ambient environment, and such insulation may enhance or improve process stability, maintain and control a desired temperature profile.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. Apparatus for high pressure material processing comprising:
    a cylindrical capsule region having a length;
    a structure configured to provide axial confinement of pressure generated within the cylindrical capsule region;
    an annular heating member enclosing the cylindrical capsule region; and
    at least two assembled rings disposed around a perimeter of the annular heating member and configured to provide radial confinement for pressure generated within the cylindrical capsule region, each of the at least two assembled rings comprising a high strength enclosure ring surrounding an annular ceramic member having a thickness, the annular ceramic member being made of a material having a compressive strength of at least 0.5 GPa and a thermal conductivity of less than about 4 watts per meter-Kelvin;
    wherein an interface between two adjacent assembled rings is located at a position along the length of the cylindrical capsule region.

2. Apparatus of claim 1 further comprising a capsule disposed within the cylindrical capsule region.

3. Apparatus of claim 2 wherein the capsule comprises a material selected from gold, platinum, silver, palladium, rhodium, titanium, rhenium, copper, stainless steel, zirconium, tantalum, and an alloy of any of the foregoing.

4. Apparatus of claim 2 wherein the capsule is characterized by a deformable material and is substantially chemically inert relative to reactants within the cylindrical capsule region.

5. Apparatus of claim 1 further comprising a cylindrical sleeve member disposed surrounding the annular ceramic member.

6. Apparatus of claim 5 wherein the cylindrical sleeve member is made of a material selected from stainless steel, iron, steel, iron alloy, nickel, nickel alloy, and a combination of any of the foregoing.

7. Apparatus of claim 1 wherein the structure configured to provide axial confinement comprises a first end flange and a second end flange.

8. Apparatus of claim 1 wherein the annular ceramic member has an inner diameter between 1.5 inches and 8 inches, a height between 0.5 inch and 8 inches, and an outer diameter, wherein a ratio between the outer diameter and the inner diameter is between 1.5 and 3.

9. Apparatus for high pressure material processing comprising:
- a cylindrical capsule region comprising a first region and a second region, and a length defined by a length the first region and a length of the second region;
- an annular heating member enclosing the cylindrical capsule region;
- a structure configured to provide axial confinement of pressure generated within the cylindrical capsule region; and
- at least two continuous annular cermet members having a thickness disposed continuously around a perimeter of the annular heating member and configured to provide radial confinement for pressure generated within the cylindrical capsule region, each of the at least two continuous annular cermet members being made of a material having a compressive strength of at least 0.5 GPa and a thermal conductivity of less than 100 watts per meter-Kelvin; and
- a high strength enclosure ring disposed surrounding each of the at least two continuous annular metal or cermet members to form a high strength enclosure stack,
- wherein an interface between two adjacent continuous annular cermet members is located at a position along the length defined between the first region and the second region.

10. Apparatus of claim 9 further comprising a capsule disposed within the cylindrical capsule region.

11. Apparatus of claim 10 wherein the capsule comprises a material selected from gold, platinum, silver, palladium, rhodium, titanium, rhenium, copper, stainless steel, zirconium, tantalum, and alloys of any of the foregoing.

12. Apparatus of claim 10 wherein the capsule is characterized by a deformable material and is substantially chemically inert relative to one or more reactants within the cylindrical capsule region.

13. Apparatus of claim 9 further comprising a cylindrical sleeve member disposed surrounding each of the at least two continuous annular cermet members.

14. Apparatus of claim 13 wherein the cylindrical sleeve member is made of a material selected from stainless steel, iron, steel, iron alloy, nickel, nickel alloy, a combination of any of the foregoing.

15. Apparatus of claim 9 wherein the structure configured to provide axial confinement comprises a first end flange and a second end flange.

16. Apparatus of claim 9 wherein the high strength enclosure ring is made of a material selected from a group consisting of steel, low-carbon steel, SA723 steel, SA 266 carbon steel, 4340 steel, A-286 steel, iron based super alloy, 304 stainless steel, 310 stainless steel 316 stainless steel, 340 stainless steel, 410 stainless steel, 17-4 precipitation hardened stainless steel, zirconium and its alloys, and titanium and its alloys.

17. Apparatus of claim 9 wherein the at least two continuous annular cermet members has an inner diameter between 1.5 inches and 8 inches, a height between 1.5 inches and 8 inches, and an outer diameter, wherein a ratio between the outer diameter and the inner diameter is between 1.5 and 3.

18. Apparatus for growing crystals comprising:
- a cylindrical capsule having a length;
- a supercritical fluid disposed within the cylindrical capsule;
- an annular heater surrounding at least a portion of the cylindrical capsule;
- at least two ceramic rings surrounding the annular heater, a metal enclosure ring surrounding each of the at least two ceramic rings, and
- a structure configured to provide axial confinement of pressure generated within the cylindrical capsule;
- wherein the at least two ceramic rings and the metal enclosure are configured to provide radial confinement for pressure generated within the cylindrical capsule; and
- wherein an interface between two adjacent ceramic rings is located at a position along the length of the cylindrical capsule.

19. Apparatus as in claim 18 wherein the metal enclosure ring is configured to resist pressure resulting from heating of the supercritical fluid disposed within the cylindrical capsule.

20. Apparatus of claim 1 wherein the high strength enclosure ring is configured to withstand a load of greater than 0.1 GPa for a predetermined time period and a temperature of 200 Degrees Celsius and below.

21. Apparatus of claim 1 wherein the high strength enclosure ring is made of a material selected from a group consisting of steel, low-carbon steel, SA723 steel, SA266 carbon steel, 4340 steel, A-286 steel, iron based super alloy, 304 stainless steel, 310 stainless steel, 316 stainless steel, 340 stainless steel, 410 stainless steel, 17-4 precipitation hardened stainless steel, zirconium and its alloys, and titanium and its alloys.

22. Apparatus of claim 9 wherein the high strength enclosure ring is configured to withstand a load of greater than 0.1 GPa for a predetermined time period and a temperature of 200 Degrees Celsius and below.

23. Apparatus of claim 1 wherein the annular ceramic member comprises a plurality of radial segments.

24. Apparatus of claim 1 wherein the annular ceramic member comprises a continuous ceramic ring.

* * * * *